United States Patent
Noh

(10) Patent No.: US 8,520,456 B2
(45) Date of Patent: Aug. 27, 2013

(54) SEMICONDUCTOR MEMORY APPARATUS FOR REDUCING CURRENT CONSUMPTION

(75) Inventor: Young Kyu Noh, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 64 days.

(21) Appl. No.: 13/211,462

(22) Filed: Aug. 17, 2011

(65) Prior Publication Data
US 2012/0120746 A1    May 17, 2012

(30) Foreign Application Priority Data
Nov. 15, 2010   (KR) ......................... 10-2010-0113289

(51) Int. Cl.
*G11C 7/00*    (2006.01)
(52) U.S. Cl.
USPC ...... 365/194; 365/191; 365/189.05; 365/233; 365/233.5
(58) Field of Classification Search
USPC .................. 365/194, 191, 189.05, 233, 233.5
See application file for complete search history.

(56) References Cited

U.S. PATENT DOCUMENTS

| | | | | |
|---|---|---|---|---|
| 6,023,442 | A | * | 2/2000 | Hachiya .................... 365/233.11 |
| 6,349,071 | B1 | * | 2/2002 | Yoshimoto ............... 365/233.14 |
| 6,480,439 | B2 | * | 11/2002 | Tokutome et al. ........ 365/189.15 |
| 8,225,032 | B2 | * | 7/2012 | Kim ............................ 711/105 |

FOREIGN PATENT DOCUMENTS

| KR | 10-2007-0075572 A | 7/2007 |
|---|---|---|
| KR | 10-2010-0001832 A | 1/2010 |

* cited by examiner

*Primary Examiner* — Connie Yoha
(74) *Attorney, Agent, or Firm* — William Park & Associates Patent Ltd.

(57) ABSTRACT

A semiconductor memory apparatus may comprise: an input buffer block configured to receive a write signal and a reference level signal, compare a the write signal with a the reference level signal to generate a first write control signal, and delay the first write control signal by a predetermined time to generate a second write control signal; a first decoder block configured to combine the second write control signal inputted from the input buffer block with externally inputted command signals, and generate a first write command signal; a clock control block configured to generate a clock control signal for determining determine a level of an internal clock signal in response to a level of the first write control signal outputted from the input buffer block; and a write signal control block configured to generate an internal write command signal according to a level of the first write command signal inputted from the first decoder block and the clock control signal inputted from the clock control block.

31 Claims, 5 Drawing Sheets

SEMICONDUCTOR MEMORY APPARATUS FOR REDUCING CURRENT CONSUMPTION

CROSS-REFERENCES TO RELATED APPLICATION

The present application claims priority to Korean Patent Application No. 10-2010-0113289, filed on Nov. 15, 2010, in the Korean Intellectual Property Office, which is incorporated herein by reference in its entirety as if set forth in full.

BACKGROUND

1. Technical Field

Various embodiments relate to semiconductor memory apparatuses. In particular, certain embodiments relate to a semiconductor memory apparatus that controls an internal clock signal in a write operation to reduce current consumption.

2. Related Art

Operations that are performed within a semiconductor memory apparatus may be classified into read operations for reading and outputting data stored in cells and write operations for storing data in cells.

A semiconductor memory apparatus typically is equipped with a command decoder that receives external commands and decodes them into appropriate internal commands. In a read operation, the command decoder receives and activates a read command, and receives an external address from an address buffer to enable a word line of a cell through a decoder. Then, a sense amplifier receives a pre-decoded address to generate a sense amplifier signal to activate a bit line sense amplifier.

While the word line is enabled, a predetermined voltage is applied to a bit line, and then amplified by the bit line sense amplifier. The amplified voltage is then transferred to an input/output line through a column gate which is controlled by a column cell selection signal, and then outputted outside the chip through a series of data output paths such as a data bus sense amplifier, a latch, and an output buffer.

In a write operation, data inputted through a series of data input paths, such as an input buffer and a write driver, is loaded on an input/output line, transferred to the bit line through a column select transistor which is controlled by the column cell selection signal, and stored.

The above is a generalized description of read and write operations of a DRAM, and it should be noted that a corresponding bank is first activated to perform a write operation.

According to the semiconductor memory apparatus as described above, a write signal may be inputted only when the corresponding bank is activated. However, since it is not possible to predict when the write signal will be activated after an active command is inputted, all circuits for the write operation need to be in operation in order to handle the write operation after the active command is inputted. Therefore, an unnecessary operation is performed before the write operation is performed, resulting in an increase in the current consumption of the semiconductor memory apparatus.

SUMMARY

Accordingly, there is a need for an improved semiconductor memory apparatus capable of reducing current consumption.

In the following description, certain aspects and embodiments will become evident. It should be understood that these aspects and embodiments are merely exemplary, and the invention, in its broadest sense, could be practiced without having one or more features of these aspects and embodiments.

In one exemplary aspect of the present invention, a semiconductor memory apparatus may comprise: an input buffer block configured to receive a write signal and a reference level signal, compare the write signal with the reference level signal to generate a first write control signal, and delay the first write control signal by a predetermined time to generate a second write control signal; a first decoder block configured to combine the second write control signal inputted from the input buffer block with externally inputted command signals, and generate a first write command signal; a clock control block configured to determine a level of an internal clock signal in response to a level of the first write control signal outputted from the input buffer block; and a write signal control block configured to generate an internal write command signal according to a level of the first write command signal inputted from the first decoder block and the level of the internal clock signal inputted from the clock control block.

In another exemplary aspect of the present invention, a semiconductor memory apparatus may comprise: an input buffer block configured to compare a write signal with a reference level signal to generate a first write control signal, and delay the first write control signal by a predetermined time to generate a second write control signal; a first decoder block configured to combine the second write control signal inputted from the input buffer block with external signals and generate a first write command signal; a clock control block configured to generate a clock control signal for determining a level of an internal clock signal in response to a level of the first write control signal outputted from the input buffer block; a clock determination unit configured to generate the internal clock signal in response to an external clock control signal and the clock control signal applied from the clock control block; and a flip-flop unit configured to receive the internal clock signal outputted from the clock determination unit and the first write command signal and generate an internal write command signal.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Figure 1:
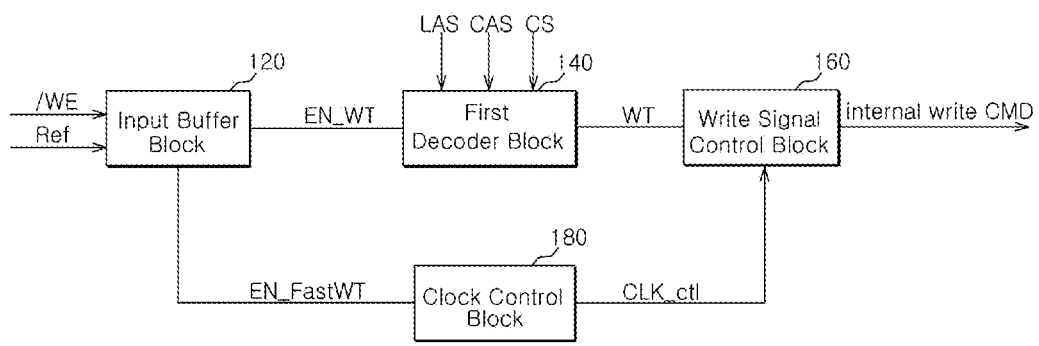
FIG. 1 is a block diagram illustrating a semiconductor memory apparatus according to one exemplary embodiment.

Reference will now be made in detail to the exemplary embodiments consistent with the present disclosure, examples of which are illustrated in the accompanying drawings. Wherever possible, the same reference characters will be used throughout the drawings to refer to the same or like parts.

FIG. 1 is a block diagram illustrating a semiconductor memory apparatus according to an exemplary embodiment of the invention.

As shown in FIG. 1, a semiconductor memory apparatus 100 according to the embodiment may comprise an input buffer block 120, a first decoder block 140, a write signal control block 160, and a clock control block 180.

The input buffer block 120 is configured to compare a write bar signal /WE with a reference level signal Ref to generate a first write control signal EN_FastWT, and delay the first write control signal EN_FastWT by a predetermined time to generate a second write control signal EN_WT.

The input buffer block 120 may comprise a set-up hold (not shown in FIG. 1) in order to generate the second write control signal by delaying the first write control signal EN_FastWT by the predetermined time. The set-up hold is a configuration generally used when an internal write command operation is performed and may be embedded in the input buffer block 120 depending on the embodiment or provided separately from the input buffer block 120.

The first decoder block 140 is configured to decode the second write control signal EN_WT inputted from the input buffer block 120 and externally inputted command signals LAS, CAS and CS, and generate a first write command signal WT.

The clock control block 180 is configured to generate a clock control signal CLK_ctl for determining the level of an internal clock signal in response to the level of the first write control signal EN_FastWT outputted from the input buffer block 120.

Accordingly, the clock control block 180 may generate the clock control signal CLK_ctl for controlling the operation of the internal clock signal, before the second write control signal EN_WT having passed through the set-up hold is received and an internal write command signal internal write CMD is generated in synchronization with the internal clock signal, to prevent a circuit from operating before the internal write command signal internal write CMD is generated, thereby reducing current consumption.

Figure 2:
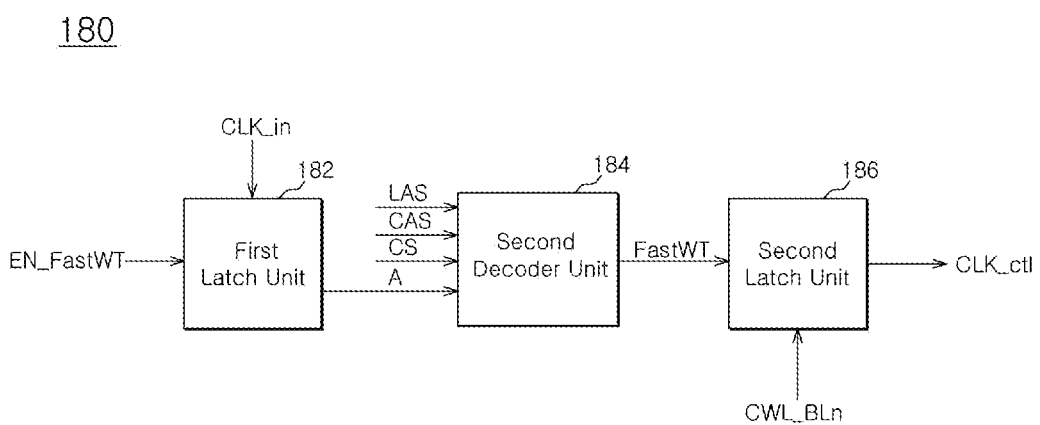
FIG. 2 is a detailed block diagram illustrating the clock control block illustrated in FIG. 1.

In more detail, as shown in FIG. 2, the clock control block 180 may comprise a first latch unit 182, a second decoder unit 184, and a second latch unit 186.

The write signal control block 160 is configured to generate an internal write command signal internal write CMD based on the levels of the first write command signal WT inputted from the first decoder block 140 and the clock control signal CLK_ctl inputted from the clock control block 180.

As described above, the semiconductor memory apparatus 100 according to an exemplary embodiment of the invention controls an unnecessary circuit operation performed prior to the write operation and the internal clock signal CLK_in, thereby substantially preventing a leakage current.

To achieve this objective, the semiconductor memory apparatus 100 according to the exemplary embodiment latches the second write control signal EN_WT generated by passing through the set-up hold in the write operation and the first write control signal EN_FastWT, which does not pass through the set-up hold, that is, which is applied to the inside of the chip ahead of the second write control signal EN_WT, by using the clock control block 180.

The latched first write control signal EN_FastWT may be generated as the second write command signal FastWT after being decoded with externally inputted signals, that is, the command signals LAS, CAS and CS. The second write command signal FastWT may be generated as the clock control signal CLK_ctl capable of controlling the operation of the internal clock signal in response to a CAS write latency signal CWL_BLn before a data is inputted.

Accordingly, the semiconductor memory apparatus 100 according to an exemplary embodiment of the invention may generate the clock control signal by using the first write control signal EN_FastWT inputted prior to the second write control signal EN_WT, thereby preventing toggle of the internal clock signal before the write operation is performed.

Figure 3:
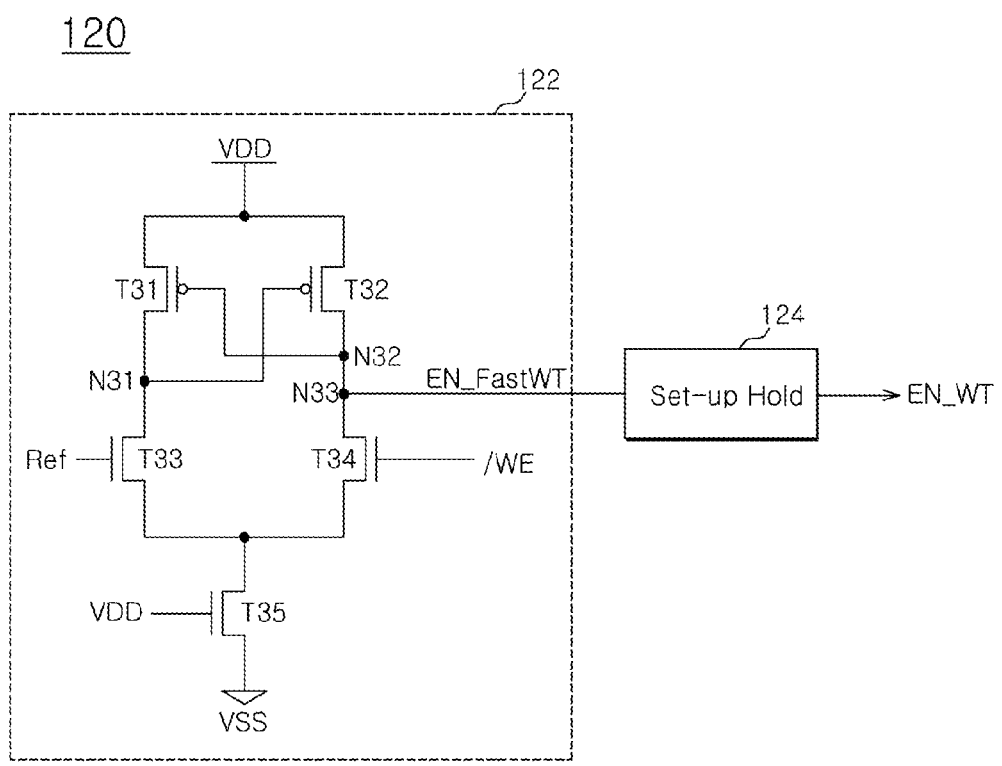
FIG. 3 is a detailed circuit diagram illustrating the input buffer block illustrated in FIG. 1.

FIG. 3 is a detailed circuit diagram of an example of the input buffer block illustrated in FIG. 1.

As shown in FIG. 3, the input buffer block 120 according to the exemplary embodiment of the invention may comprise a differential amplification unit 122 and a set-up hold 124. The differential amplification unit 122 is configured to compare the level of the write bar signal /WE with the level of the externally applied reference level signal Ref and determine the voltage level of the first write control signal EN_FastWT. The set-up hold 124 is configured to delay the first write control signal EN_FastWT by a predetermined time and generate the second write control signal EN_WT. Since the set-up hold 124 is a configuration generally used, detailed description thereof will be omitted herein.

The differential amplification unit 122 comprises a first and a second mirror transistors T31 and T32 coupled to an external driving voltage terminal VDD, that constitute a current mirror, first and second input transistors T33 and T34 forming a differential pair, and a sink transistor T35 serving as a current source.

According to an exemplary operation method of the differential amplification unit 122, the differential amplification unit 122 receives the externally applied reference level signal Ref and the externally applied write bar signal /WE through the first and second input transistors T33 and T34, respectively.

In the exemplary embodiment, the differential amplification unit 122 compares the level of the reference level signal Ref with the level of the write bar signal /WE, which are applied to the first and second input transistors T33 and T34.

As a result of the comparison, when the level of the write bar signal /WE is higher than the level of the reference level signal Ref, the differential amplification unit 122 may generate the first write control signal EN_FastWT at a high level and output the first write control signal EN_FastWT to the clock control block 180 and the set-up hold 124, due to a large amount of current flowing through an output node N33.

However, when the level of the write bar signal /WE is lower than the level of the reference level signal Ref, the differential amplification unit 122 may generate the first write control signal EN_FastWT at a low level and output the first write control signal EN_FastWT to the clock control block 180 and the set-up hold 124, due to preventing flow of current and keeping precharge status of node N33 through the output node N33.

As described above, the input buffer block 120 according to the embodiment of the invention compares the level of the write bar signal /WE with the level of the externally applied reference level signal Ref and provides the clock control block 180 with the first write control signal EN_FastWT which has not passed through the set-up hold 124, thereby quickly informing the internal circuits of the semiconductor memory apparatus of the entry of the write command signal. This results in the reduction in unnecessary current consumption as compared with the conventional art.

Figure 4:
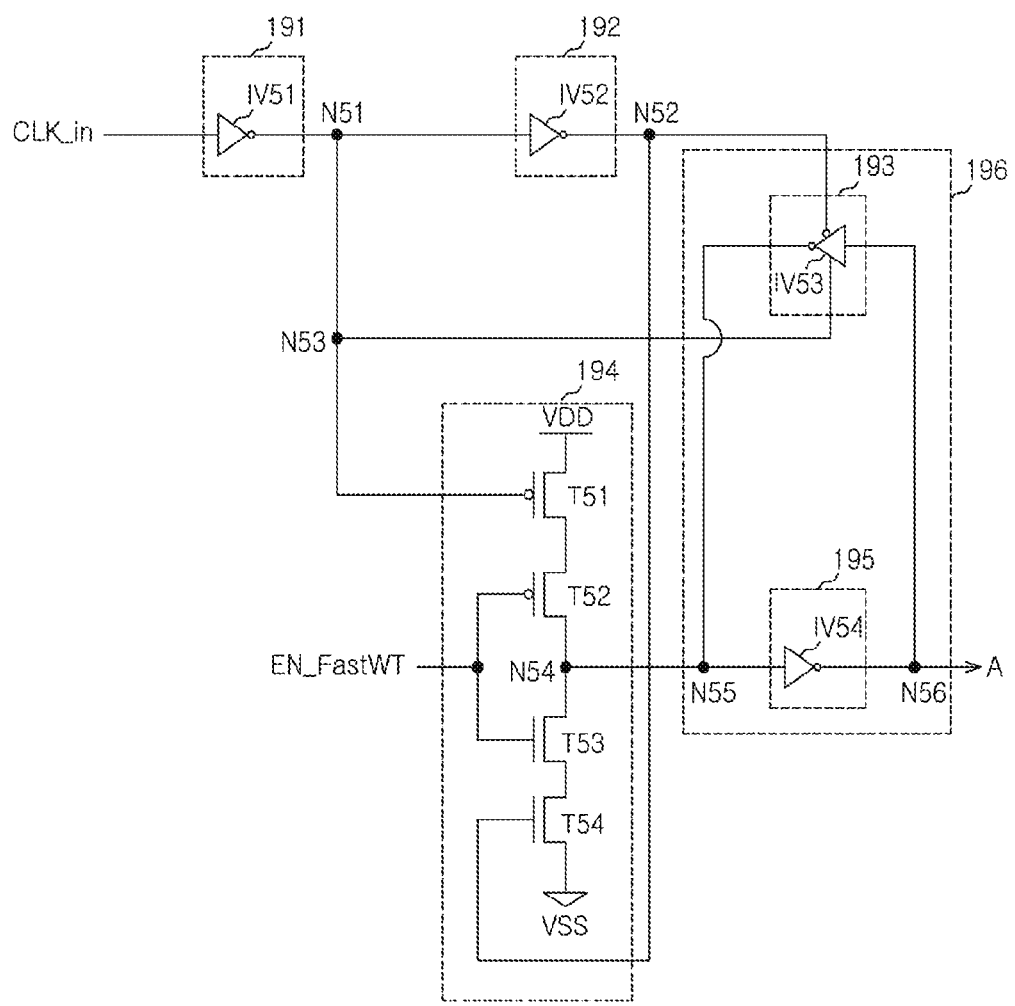
FIG. 4 is a detailed circuit diagram illustrating the first latch unit of the clock control block illustrated in FIG. 2.

FIG. 4 is a detailed circuit diagram illustrating the first latch unit of the clock control block illustrated in FIG. 2.

As shown FIG. 4, the first latch unit 182 of the clock control block 180 according to an exemplary embodiment of the invention may comprise a first switching section 194 and a storage section 196. The first switching section 194 is configured to activate the first write control signal EN_FastWT, which is applied from the input buffer block 120, in response to the internal clock signal CLK_in. The storage section 196 is configured to latch and output a detection value of a first output node N55, which is provided at an output terminal of the first switching section 194, in response to the internal clock signal CLK_in.

The storage section 196 may comprise an inversion section 195 and a second switching section 193. The inversion section 195 is configured to invert the level value detected at the first output node N55. The second switching section 193 forms a latch structure with the inversion section 195 to output a level value, which is detected at a second output node N56 that is formed at an output terminal of the inversion section 195, to the first output node N55 in response to the internal clock signal CLK_in.

In more detail, according to the operation of the clock control block 180 illustrated in FIG. 4, the internal clock signal CLK_in generated in an internal chip may be inverted by first and second inverters 191 and 192 and then inputted to the first switching section 194 and the second switching section 193.

For example, when the internal clock signal CLK_in is at a high level, the first switching section 194 is turned on, that is, first and fourth transistors T51 and T54 of the first switching section 194 are activated, so that the first write control signal EN_FastWT is outputted to the first output node N55.

In more detail, when a high level first write control signal EN_FastWT is inputted to the first switching section 194, the amount of a current flowing through a detection node N54 is reduced, and a low level output signal is outputted. However, when a low level first write control signal EN_FastWT is inputted to the first switching section 194, the amount of the current flowing through the detection node N54 is increased, and a high level output signal at a high level is outputted.

When the internal clock signal CLK_in is at a high level, the first switching section 194 is activated as described above, and it is possible to generate the first write control signal EN_FastWT outputted from the input buffer block 120 as an output signal, and provide the output signal to the inversion section 195 of the storage section 196.

Furthermore, when the internal clock signal CLK_in is at a high level, the second switching section 193 of the storage section 196 does not operate and only the inversion section 195 of the storage section 196 is driven, so that it is possible to output a signal obtained by inverting the level detected at the first output node N55.

However, when the internal clock signal CLK_in is at a low level, the first switching section 194 does not operate, and the storage section 196 continuously latches the level detected at the first output node N55.

In more detail, when the internal clock signal CLK_in is at a low level, the second switching section 193 of the storage section 196 may be activated through the signal inputted through the first and second inverters 191 and 192, and the second switching section 193 may switch a signal having a level value detected at the second output node N56 and output the signal to the first output node N55. At this time, since the inversion section 195 inverts the level value detected at the first output node N55 and outputs the level value to the second output node N56, the storage section 196 may continuously form a latch structure if the level of the output signal outputted from the first switching section 194 does not change.

As described above, since the first latch unit 182 according to an exemplary embodiment of the invention drives the first write control signal EN_FastWT according to the level of the internal clock signal CLK_in, all operations before the write operation are stopped, resulting in the reduction in unnecessary current consumption.

Figure 5:
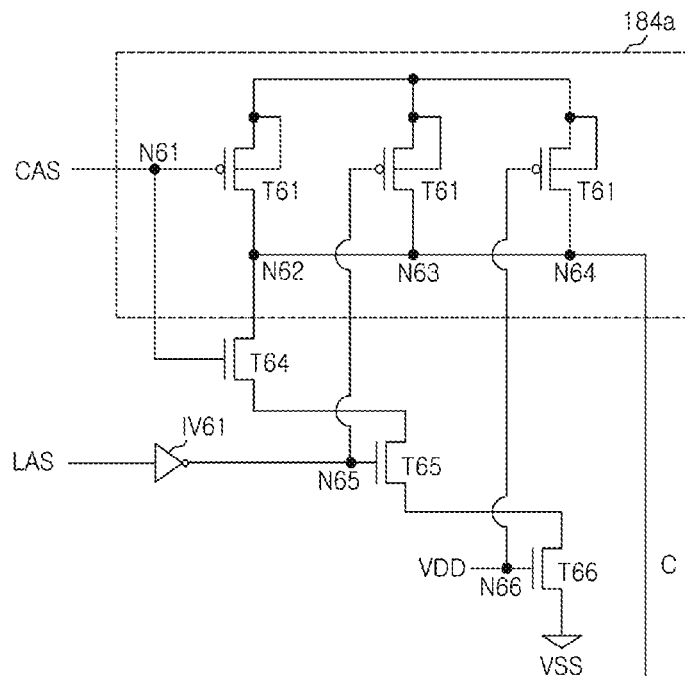
FIG. 5 is a detailed circuit diagram illustrating the second decoder unit of the clock control block illustrated in FIG. 2.
Figure 5:
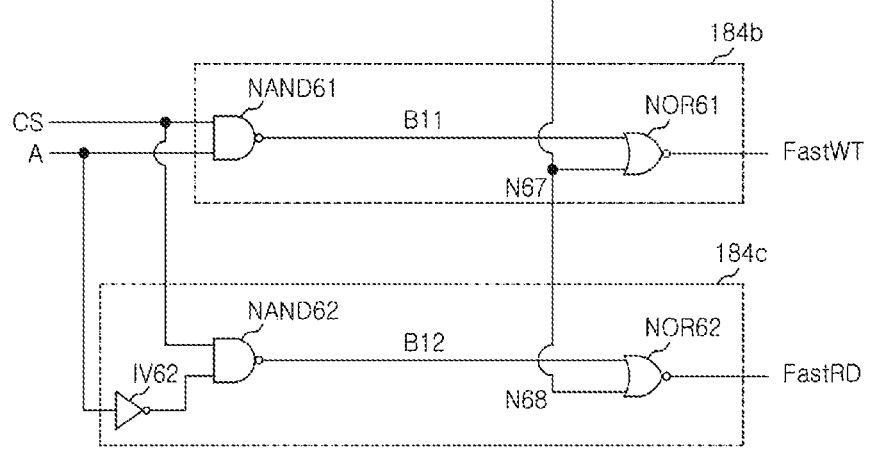

FIG. 5 is a detailed circuit diagram illustrating the second decoder unit of the clock control block illustrated in FIG. 2.

Referring to FIG. 5, the second decoder unit 184 of the clock control block 180 comprises an external signal generation section 184a, a write command signal generation section 184b, and a read command signal generation section 184c.

The external signal generation section 184a is configured to decode the external command signals LAS and CAS inputted from input buffer unit 120 and generate an external signal C, and provide the external signal C to the write command signal generation section 184b and the read command signal generation section 184c.

The write command signal generation section 184b comprises a first combination section NAND61 and a second combination section NOR61. The first combination section NAND61 is configured to combine an externally inputted chip select signal CS with the signal A outputted from the first latch unit 182 and generate a first combination signal B11. The second combination section NOR61 is configured to combine the first combination signal B11 applied from the first combination section NAND61 with the external signal C and generate the second write command signal FastWT.

The read command signal generation section 184c comprises a third combination section NAND62 and a fourth combination section NOR62. The third combination section NAND62 is configured to combine the externally inputted chip select signal CS with a signal obtained by inverting the level of the signal A outputted from the first latch unit 182. The fourth combination section NOR62 is configured to combine a second combination signal B12 applied from the third combination section NAND62 with the external signal C and generate a read command signal Fast RD.

Since the embodiment of the invention relates to write operations, only the operation of the write command signal generation section 184b will be described below.

The first combination section NAND61 of the write command signal generation section 184b combines the externally inputted chip select signal CS with the signal A outputted from the first latch unit 182 to generate the first combination signal B11. The first combination section NAND61 may include a NAND gate. When at least one of the chip select signal CS or the output signal A has a low level, the NAND gate may generate the first combination signal B11 at a high level. Meanwhile, when both the chip select signal CS and the output signal A have a high level, the NAND gate may generate the first combination signal B11 at a low level.

The second combination section NOR61 of the write command signal generation section 184b combines the first combination signal B11 applied from the first combination section NAND61 with the external signal C applied from the external signal generation section 184a to generate the second write command signal FastWT, which has an advanced timing compared to the first write command signal WT. The section combination section NOR61 may include a NOR gate. When at least one of the first combination signal B11 or the output signal C has a high level, the NOR gate may generate the second write command signal FastWT at a low level. Meanwhile, when both the first combination signal B11 and the output signal C have a low level, the NOR gate may generate the second write command signal FastWT at a high level.

As described above, the write command signal generation section 184b according to the embodiment of the invention decodes the output signal A responding to the externally applied command signals LAS, CAS and CS and the internal clock signal CLK_in, and generates the second write command signal FastWT having an advanced timing compared to the first write command signal WT, so that all operations prior to the write operation are stopped, resulting in the reduction of unnecessary current consumption.

Figure 6:
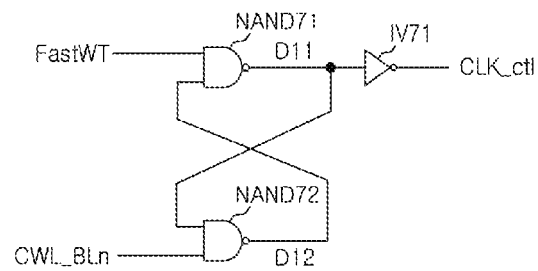
FIG. 6 is a detailed circuit diagram illustrating the second latch unit of the clock control block illustrated in FIG. 2.

FIG. 6 is a detailed circuit diagram illustrating the second latch unit of the clock control block illustrated in FIG. 2.

Referring to FIG. 6, the second latch unit 186 of the clock control block 180 according to an exemplary embodiment of the invention comprises first and second NAND combination sections NAND71 and NAND72 coupled to each other in a latch structure. The first NAND combination section NAND71 is configured to receive the second write command signal FastWT applied from the second decoder unit 184 and a second signal D12 outputted from the second NAND combination section NAND72 and generate a first signal D11.

The second NAND combination section NAND72 is configured to receive the CAS write latency signal CWL_BLn and the first signal D11 outputted from the first NAND combination section NAND71, and generate the second signal D12.

Since the CAS write latency signal CWL_BLn is generated by the write signal control block 160, generally used as a signal for discharging the internal clock signal CLK_in. The CAS write latency signal CWL_BLn becomes low level when the CAS write latency signal CWL_BLn is passed a delay time according to write command delay information, detailed description thereof will be omitted.

The second latch unit 186 according to an exemplary embodiment of the invention may further include an inversion section IV71 which is configured to invert the level of the first signal D11 and generate the clock control signal CLK_ctl.

In an operation of the second latch unit 186 according to an exemplary embodiment of the invention, the first NAND combination section NAND71 combines the second write command signal FastWT with the second signal D12 to generate the first signal D11. At this time, when the second write command signal FastWT at a low level is inputted, the first NAND combination section NAND71 generates the first signal D11 at a high level, and the level of the generated first signal D11 may be generated as the clock control signal CLK_ctl at a low level by the inversion section IV71.

Meanwhile, when the second write command signal FastWT at a high level is inputted, the first NAND combination section NAND71 determines the level of the first signal D11 by the second signal D12 applied from the second NAND combination section NAND72.

In the case where the level of the clock control signal CLK_ctl is low, since the internal write command signal internal write CMD is not generated, the operation of a circuit may be interrupted and unnecessary current consumption may be reduced.

Figure 7:
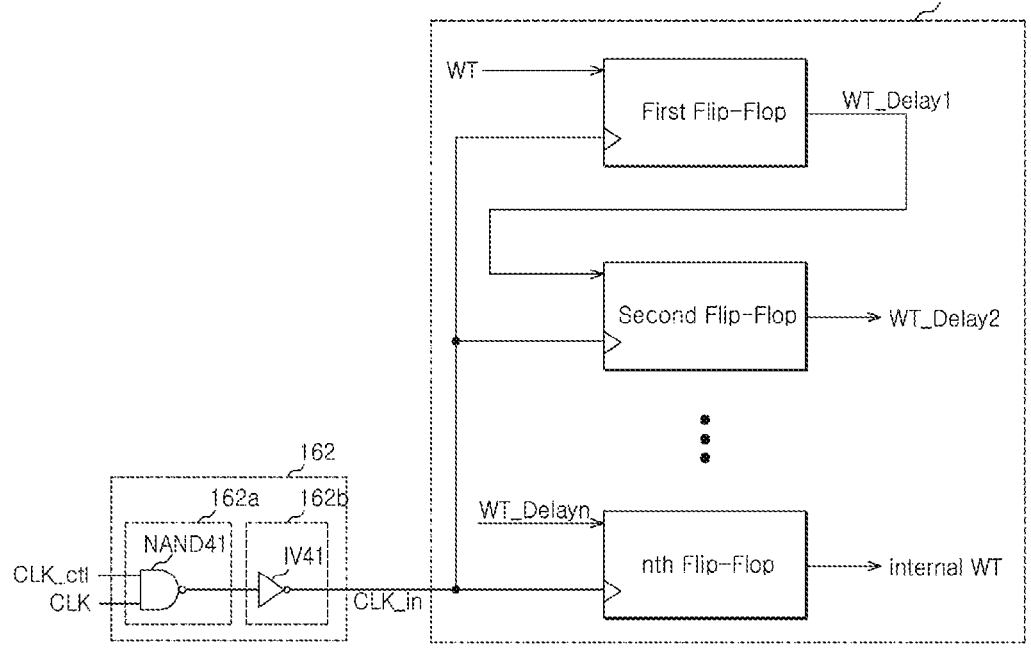
FIG. 7 is a detailed circuit diagram illustrating the write signal control block illustrated in FIG. 1.

FIG. 7 is a detailed circuit diagram illustrating the write signal control block illustrated in FIG. 1.

Referring to FIG. 7, the write signal control block 160 according to the embodiment of the invention comprises a clock determination unit 162 and a flip-flop unit 164. The clock determination unit 162 is configured to determine the level of the internal clock signal CLK_in in response to the clock control signal CLK_ctl and an external clock signal CLK. The flip-flop unit 164 is configured to receive the internal clock signal CLK_in outputted from the clock determination unit 162 and the first write command signal WT and generate the internal write command signal internal write CMD.

The clock determination unit 162 comprises a first logic gate 162a configured to combine the clock control signal CLK_ctl with the external clock signal CLK, and an inversion inverter 162b configured to invert a signal generated by the first logic gate 162a.

Here, the first logic gate 162a includes, for example, a NAND gate, and may generate a signal with a high level when the clock control signal CLK_ctl is inputted at a low level. As the signal with the high level is inverted by an inverter IV41 and becomes a low level, a circuit is prevented from operating.

Conversely, if the clock control signal is inputted at a high level and the external clock signal CLK has a high level, the signal becomes a high level by the inverter IV41 and the internal write command signal internal write CMD is generated.

Consequently, the semiconductor memory apparatus according to an exemplary embodiment of the invention generates the internal clock signal CLK_in at a low level prior to the write operation through the clock determination unit 162, resulting in the reduction of unnecessary current consumption.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
    an input buffer block configured to receive a write signal and a reference level signal, compare the write signal with the reference level signal to generate a first write control signal, and delay the first write control signal by a predetermined time to generate a second write control signal;
    a first decoder block configured to combine the second write control signal inputted from the input buffer block with externally inputted command signals, and generate a first write command signal;
    a clock control block configured to generate a clock control signal for determining a level of an internal clock signal in response to a level of the first write control signal outputted from the input buffer block; and
    a write signal control block configured to generate an internal write command signal according to the first write command signal inputted from the first decoder block and the clock control signal inputted from the clock control block.

2. The semiconductor memory apparatus according to claim 1, wherein the input buffer block comprises:
    a differential amplification unit configured to compare a level of the write signal with an external reference voltage signal and determine the voltage level of the first write control signal; and
    a set-up hold configured to delay the first write control signal by the predetermined time and generate the second write control signal.

3. The semiconductor memory apparatus according to claim 1, wherein the clock control block comprises:
a first latch unit configured to latch the level of the first write control signal, which is applied from the input buffer block, in response to the internal clock signal;
a second decoder unit configured to decode an output signal outputted from the first latch unit and an external command signal and generate a second write command signal; and
a second latch unit configured to generate the second write command signal outputted from the second decoder unit as a clock control signal.

4. The semiconductor memory apparatus according to claim 3, wherein the first latch unit comprises:
a first switching section configured to switch the first write control signal in response to the internal clock signal; and
a storage section configured to store a level of an output signal detected at a first output node of the first switching section in response to the internal clock signal.

5. The semiconductor memory apparatus according to claim 4, wherein the storage section comprises:
an inversion section configured to invert a level of the output signal inputted from the first output node; and
a second switching section configured to form a latch structure with the inversion section to output an output signal from a second output node of the inversion section, to the first output node in response to the internal clock signal.

6. The semiconductor memory apparatus according to claim 3, wherein the second decoder unit comprises:
a first combination section configured to output a first combination signal by combining a chip select signal with the output signal; and
a second combination section configured to combine the first combination signal applied from the first combination section with the command signal and generate the second write command signal.

7. The semiconductor memory apparatus according to claim 6, wherein the first combination section is configured to output the first combination signal at a high level when at least one of the chip select signal or the output signal is inputted at a low level.

8. The semiconductor memory apparatus according to claim 7, wherein the second combination section is configured to output the second combination signal at a high level when at least one of the first combination signal or the command signal is inputted at a high level.

9. The semiconductor memory apparatus according to claim 3,
wherein the second latch unit comprises first and second NAND combination sections coupled to each other in a latch structure, and wherein the first NAND combination section is configured to receive the second write command signal and a fourth combination signal outputted from the second NAND combination section, and generate a third combination signal; and
wherein the second NAND combination section is configured to receive the command signal and the third combination signal outputted from the first NAND combination section, and generate the fourth combination signal.

10. The semiconductor memory apparatus according to claim 9, wherein the first NAND combination section is configured to output the third combination signal at a high level when a low level second write command signal is inputted, and the second NAND combination section is configured to output the fourth combination signal at a high level when a low level command signal is inputted.

11. The semiconductor memory apparatus according to claim 10, wherein the second latch unit further comprises:
a clock inversion section configured to invert a level of the third combination signal and generate the clock control signal.

12. The semiconductor memory apparatus according to claim 1, wherein the write signal control block comprises:
a clock determination unit configured to determine the level of the internal clock signal in response to the clock control signal and an external clock control signal; and
a flip-flop unit configured to receive the internal clock signal outputted from the clock determination unit and the first write command signal and generate the internal write command signal.

13. A semiconductor memory apparatus comprising:
an input buffer block configured to compare a write signal with a reference level signal to generate a first write control signal and delay the first write control signal by a predetermined time to generate a second write control signal;
a first decoder block configured to combine the second write control signal inputted from the input buffer block with external signals, and generate a first write command signal;
a clock control block configured to generate a clock control signal for determining a level of an internal clock signal in response to a level of the first write control signal outputted from the input buffer block;
a clock determination unit configured to generate the internal clock signal in response to an external clock control signal and the clock control signal applied from the clock control block; and
a flip-flop unit configured to receive the internal clock signal outputted from the clock determination unit and the first write command signal and generate an internal write command signal.

14. The semiconductor memory apparatus according to claim 13, wherein the input buffer block comprises:
a differential amplification unit configured to compare a level of the write signal with an external reference voltage signal and determine the voltage level of the first write control signal; and
a set-up hold configured to delay the first write control signal by the predetermined time and generate the second write control signal.

15. The semiconductor memory apparatus according to claim 13, wherein the clock control block comprises:
a first latch unit configured to latch the level of the first write control signal, which is applied from the input buffer block, in response to the internal clock signal;
a second decoder unit configured to decode an output signal outputted from the first latch unit and an external command signal and generate a second write command signal; and
a second latch unit configured to latch and output the second write command signal, which is outputted from the second decoder unit, and generate a clock control signal.

16. The semiconductor memory apparatus according to claim 15, wherein the first latch unit comprises:
a first switching section configured to output the first write control signal in response to the internal clock signal; and
a storage section configured to store a level of an output signal detected at a first output node of the first switching section in response to the internal clock signal.

17. The semiconductor memory apparatus according to claim 16, wherein the storage section comprises:
an inversion section configured to invert a level of the output signal inputted from the first output node; and
a second switching section configured to form a latch structure with the inversion section to output an output signal from a second output node of the inversion section, to the first output node in response to the internal clock signal.

18. The semiconductor memory apparatus according to claim 17, wherein the second decoder unit comprises:
a first combination section configured to output a first combination signal by combining a chip select signal with the output signal; and
a second combination section configured to combine the first combination signal applied from the first combination section with the command signal and generate the second write command signal.

19. The semiconductor memory apparatus according to claim 18, wherein the first combination section is configured to output the first combination signal at a high level when at least one of the chip select signal or the output signal is inputted at a low level.

20. The semiconductor memory apparatus according to claim 19, wherein the second combination section is configured to output the second combination signal at a high level when at least one of the first combination signal or the command signal is inputted at a high level.

21. The semiconductor memory apparatus according to claim 20,
wherein the second latch unit comprises first and second NAND combination sections coupled to each other in a latch structure, and wherein the first NAND combination section is configured to receive the second write command signal and a fourth combination signal outputted from the second NAND combination section, and generate a third combination signal; and
wherein the second NAND combination section is configured to receive the command signal and the third combination signal outputted from the first NAND combination section, and generate the fourth combination signal.

22. The semiconductor memory apparatus according to claim 21, wherein the first NAND combination section is configured to output the third combination signal at a high level when a low level second write command signal is inputted, and the second NAND combination section is configured to output the fourth combination signal at a high level when a low level command signal is inputted.

23. The semiconductor memory apparatus according to claim 22, wherein the second latch unit further comprises:
an inversion inverter configured to invert a level of the third combination signal and generate the clock control signal.

24. A semiconductor memory apparatus comprising:
an input buffer block configured to compare a write signal with a reference level signal and generate a first write control signal, and delay the first write control signal by a predetermined time and generate a second write control signal;
a first latch unit configured to generate the first write control signal outputted from the input buffer block, as an output signal depending upon a level of an internal clock signal;
a decoder unit configured to decode the output signal outputted from the first latch unit and an external command signal inputted from an outside, and generate a write command signal; and
a second latch unit configured to generate a clock control signal using the write command signal outputted from the decoder unit, in response to a CAS write latency signal.

25. The semiconductor memory apparatus according to claim 24, wherein the first latch unit comprises:
a first switching section configured to switch the first write control signal in response to the internal clock signal; and
a storage section configured to store a level of an output signal detected at a first output node of the first switching section, in response to the internal clock signal.

26. The semiconductor memory apparatus according to claim 25, wherein the storage section comprises:
an inversion section configured to invert the level of the output signal inputted from the first output node; and
a second switching section configured to output an output signal outputted from a second output node of the inversion section, to the first output node in response to the internal clock signal.

27. The semiconductor memory apparatus according to claim 24, wherein the decoder unit comprises:
a first combination section configured to combine the output signal outputted from the first latch unit with a chip select signal outputted from an outside, and generate a first combination signal; and
a second combination section configured to combine the first combination signal applied from the first combination section with a command signal inputted from an outside, and generate the write command signal.

28. The semiconductor memory apparatus according to claim 27, wherein the first combination section generates the first combination signal of a high level when at least one of the output signal and the chip select signal is inputted at a low level.

29. The semiconductor memory apparatus according to claim 28, wherein the second combination section generates the write command signal of a high level when at least one of the first combination signal and the command signal is inputted at a high level.

30. The semiconductor memory apparatus according to claim 24, wherein the second latch unit comprises first and second NAND combination sections which are coupled with each other in an SR latch structure, and generates the clock control signal with a low level according to delay information of the CAS write latency signal when the write command signal of the high level is inputted.

31. The semiconductor memory apparatus according to claim 30, wherein the CAS write latency signal discharges the internal clock signal, has write command delay information, and becomes a low level when a delay time is elapsed according to the delay information.

* * * * *